United States Patent
Letzelter et al.

(10) Patent No.: US 12,073,526 B2
(45) Date of Patent: Aug. 27, 2024

(54) FLEXIBLE MODELING USING A WEAK TYPE DEFINITION

(71) Applicant: DASSAULT SYSTEMES, Velizy-Villacoublay (FR)

(72) Inventors: Frederic Letzelter, Velizy-Villacoublay (FR); Yani Sadoudi, Velizy-Villacoublay (FR)

(73) Assignee: DASSAULT SYSTEMES, Velizy-Villacoublay (FR)

( * ) Notice: Subject to any disclaimer, the term of this patent is extended or adjusted under 35 U.S.C. 154(b) by 312 days.

(21) Appl. No.: 16/730,849

(22) Filed: Dec. 30, 2019

(65) Prior Publication Data
US 2020/0211296 A1   Jul. 2, 2020

(30) Foreign Application Priority Data
Dec. 30, 2018   (EP) .................................... 18306890

(51) Int. Cl.
*G06T 19/20*   (2011.01)
*G06T 17/20*   (2006.01)

(52) U.S. Cl.
CPC ............ *G06T 19/20* (2013.01); *G06T 17/205* (2013.01); *G06T 2200/24* (2013.01); *G06T 2219/2004* (2013.01); *G06T 2219/2016* (2013.01)

(58) Field of Classification Search
CPC ....... G06T 17/00; G06T 2200/24; G06T 7/75; G06T 11/206; G06T 19/00; G06T 13/20; G06T 19/20; G06T 17/205; G06T 2219/2004; G06F 30/13; G06F 30/00; G06F 30/10; G06F 30/12
See application file for complete search history.

(56) References Cited

U.S. PATENT DOCUMENTS

| | | | |
|---|---|---|---|
| 9,117,308 B1 | 8/2015 | Nag et al. | |
| 2011/0025688 A1* | 2/2011 | Schneider | ............... G06T 19/20 345/420 |
| 2012/0084060 A1 | 4/2012 | Gunasena et al. | |

FOREIGN PATENT DOCUMENTS

| | | |
|---|---|---|
| CN | 102332039 A | 1/2012 |
| EP | 1 501 026 A1 | 1/2005 |
| JP | 2006-209233 A | 8/2006 |
| WO | WO 2006/038733 A2 | 4/2006 |
| WO | WO 2016/207991 A1 | 12/2016 |

OTHER PUBLICATIONS

Jong Ha Hwang, Keung Hae Lee, and Soochan Hwang, 3DGML: A 3-Dimensional Graphic Information Retrieval System, LNAI 2198, pp. 282-291, 2001 (Year: 2001).*

(Continued)

*Primary Examiner* — Weiming He
(74) *Attorney, Agent, or Firm* — Oblon, McClelland, Maier & Neustadt, L.L.P.

(57) ABSTRACT

The disclosure notably relates to a three-dimensional (3D) model. The data structure includes one delegated data object. The one delegate data object includes input parameters specific to a type of the delegated data object, and at least one operator specific to the type of the delegated data object for generating an output topology. The data structure also includes an output topology generated by the operator.

18 Claims, 8 Drawing Sheets

(56) References Cited

OTHER PUBLICATIONS

Yonghwan Kim and Soochan Hwang, A Content-Based 3D Graphic Information Retrieval System, LNCS 4182, pp. 567-573, 2006 (Year: 2006).*
George Omura, Mastering AutoCAD 2016 and AutoCAD LT 2016 (Year: 2016).*
Extended European Search Report dated Jun. 28, 2019 in European Patent Application No. 18306891.5.
Extended European Search Report dated Jul. 5, 2019 in European Patent Application No. 18306890.7.
Thomas Convard et al., History Based Reactive Objects for Immersive CAD, ACM Symposium on Solid Modeling and Applications (2004), pp. 291-296.
Office Action dated Feb. 6, 2024, issued in JP Application No. 2019-233117 filing date of Dec. 24, 2019, with English machine translation. (6 pages).
Office Action dated Feb. 6, 2024, issued in counterpart JP Application No. 2019-233118 filing date of Dec. 24, 2019, with English machine translation. (7 pages).
Office Action dated Mar. 12, 2024, issued in counterpart CN Application No. 201911393839.5, with English Translation, citing documents No. 15. (12 pages).

\* cited by examiner

FLEXIBLE MODELING USING A WEAK TYPE DEFINITION

CROSS-REFERENCE TO RELATED APPLICATIONS

This application claims priority under 35 U.S.C. § 119 or 365 to European Application No. 18306890.7, filed Dec. 30, 2018. The entire contents of the above application(s) are incorporated herein by reference.

FIELD OF THE INVENTION

The disclosure relates to the field of computer programs and systems, and more specifically to a data structure, method, system and program for designing a 3D model.

BACKGROUND

A number of systems and programs are offered on the market for the design, the engineering and the manufacturing of objects. CAD is an acronym for Computer-Aided Design, e.g. it relates to software solutions for designing an object. CAE is an acronym for Computer-Aided Engineering, e.g. it relates to software solutions for simulating the physical behavior of a future product. CAM is an acronym for Computer-Aided Manufacturing, e.g. it relates to software solutions for defining manufacturing processes and operations. In such computer-aided design systems, the graphical user interface plays an important role as regards the efficiency of the technique. These techniques may be embedded within Product Lifecycle Management (PLM) systems. PLM refers to a business strategy that helps companies to share product data, apply common processes, and leverage corporate knowledge for the development of products from conception to the end of their life, across the concept of extended enterprise. The PLM solutions provided by Dassault Systèmes (under the trademarks CATIA, ENOVIA and DELMIA) provide an Engineering Hub, which organizes product engineering knowledge, a Manufacturing Hub, which manages manufacturing engineering knowledge, and an Enterprise Hub which enables enterprise integrations and connections into both the Engineering and Manufacturing Hubs. All together the system delivers an open object model linking products, processes, resources to enable dynamic, knowledge-based product creation and decision support that drives optimized product definition, manufacturing preparation, production and service.

CAD software propose ways to create three-dimensional (3D) models called parts using a set of tools that can be divided in two categories: History-based approach (also referred to as Parametric Modeling) and History-free approach (also referred to as Explicit Modeling)

History-based approach was designed to capture design intent by storing each step of the creation process using features, constraints, etc. . . . . . It is really like a part recipe; each step of the creation exposes a set of parameters the user can change. If he does change one parameter, the whole 'recipe' is replayed in the same exact order to regenerate the new part. This approach is generally represented with a tree which allows the user to quickly understand the order of the operations.

History-free approach does not rely on a sequence of operations being replayed at each modification. Each modification is done on the current 3D model. That is to say that there are no intermediary steps, no "recipe", when the user modifies his design, the modification is absorbed by the feature and as such, the parameters leading to the modification are not kept. This approach allows the user to create 3D model more quickly and more freely because the order in which the operations are done is not kept. The user can focus on the geometry he is creating instead of worrying about the order in which he should create his features. Moreover, he does not have to worry about the impact of his modification.

The advantage of the history-based approach is also its drawback. The parametric approach, although it is very convenient to be able to change parameters almost anytime, brings rigidity to the design process. Once the 'recipe' is created, each feature being strongly typed, you can only play with the parameters. Any other change can be very complicated because, to get the change the user wants, he has to think about how it will affect the result when the part is regenerated. In a context where the user wants to test different type of shapes and wants to iterate quickly, this is a major drawback. History-based approach is mainly used to create mechanical parts that represent objects of the real-world to be manufactured while history-free approach is mainly dedicated to organic shapes of products, in the Concept Modeling or class A stages.

The objects used in the history-based approach are strongly typed. In order to change the type of an object, one needs to create a whole new object and replace the original one by the new one in the tree representing operation orders. The new object having no link whatsoever with the replaced one, may not fit well in the current "recipe" due to topology changes. It happens if an operation cannot find anymore the elements it needed to compute its modification because the object it relies on changed. In this case, the user will have to explicitly tell the system how to do it. It is a tedious task and the more complex the history is, the more tedious and time consuming.

With the history-free approach, the user is able to quickly iterate on the shape because the feature he is working on is not typed at all. The user does not need to take care of the consequences of the current modifications on the history of object being designed. In addition, the user works on the current state of the object because no history is stored in the generic feature (the one being designed). So even though the user can iterate quickly on his shape, he can only modify the current state of his 3D shape. He does not have access to any parameters of any of his previous operations.

The history-based and the history-free approaches are not incompatible, as an object generated from an history-free context can be integrated in an history-based context. To be more precise, a user could create an history-free model and apply operations on it which will generate a new 3D model from it.

However, the respective data structures of these two approaches are not interoperable. Indeed, data structures for objects generated by the history-based and history free-approach are a bit different; notably because the data structures of object in the history-based approach is strongly typed, while the data structure in the history-free approach is objects are not typed (the designers works on a generic feature also called "datum", which is a generic feature without any entry. The type of a 3D model in a history-based context refers to its characteristics, it is defined by a set of parameters and at least one operation taking as inputs the set of parameters and returning as an output the object's topology. For instance, and in reference to FIG. 1, a 3D Sphere is a typed 3D model, the "sphere" type comes with its set of parameters that are its center, radius and opening angle. This comes with an operation that takes all these parameters as input and is able to return the topology of the sphere. On the contrary, in a history free context, the shapes created have no type by definition as the object does not have any parameters. Each operation applied on the object is applied on the current definition of this object. In the example of FIG. 3, the user would only access the topology of the sphere, that is, the wireframe that is comprised of all the vertices, edges and from that information the faces can be made.

To summarize, the data structure of the history-based approach comprises input parameters specific to the type, at least one operation specific to the type, and output topology generated by the previous operation(s). The data structure of the history-free approach comprises the current topology generated by the last external operation applied on the object.

Because of these fundamental differences between the two approaches, current history-free approaches do not allow to retrieve the "recipe" of the modifications performed by the user on the 3D model (which amounts to say on the mesh). Especially, it is not possible to automatically retrieve and apply the same or similar design operations performed on a first 3D model on a new mesh. For instance, a designer that has modified the design of the door of a first model of car cannot automatically apply the same modifications on the door of a second car model. This means that it is almost impossible to reuse a design intent in a history-free CAD approach; the designer has to intuitively apply modifications on the mesh of the second model of car with the hope to reproduce his/her initial design intent.

Within this context, there is still a need for an improved data structure defining a 3D model for history-free approach.

SUMMARY OF THE INVENTION

It is therefore provided a data structure defining a three-dimensional (3D) model. The data structure comprises one delegated data object. The said one delegated data object comprises input parameters specific to a type of the delegated data object, and at least one operator specific to the type of the delegated data object for generating an output topology. The data structure also comprises an output topology generated by the operator.

The data structure may further comprise an interface to add or remove at least one operator.

It is also provided a computer-implemented method for designing a three-dimensional (3D) model. The method comprises providing a first data structure, the first data structure defining a first 3D model comprising a first delegated data object and a first output topology, modifying, upon user action, the first delegated data object, computing a second output topology as a result of the modification of the first data structure, determining whether a change of topology occurred by comparing of the first and second output topologies, replacing the first delegated data object by a second delegated data object if a change of topology is determined between the first and second output topologies or keeping the first delegated data object if no change of topology is determined.

The method may further comprise one or more of the following:
  replacing the delegated data object by the second delegated data object comprises: —comparing the second output topology with a list of output topologies, each output topology of the list being associated with one delegated data object; —automatically selecting a third delegated data object as a result of the comparison, the third delegated data object being a delegated data object of the list with an associated output topology that is the same as the second output topology;
  if no delegated data object of the list is selected as a result of the comparison: —providing the user with one or more one delegated data objects of the list having associated output topologies that are the closest to the second output topology, including one generic delegated data object; —selecting by the user one of the provided delegated data objects;
  modifying, upon user action, the first delegated data object comprises: —modifying one or more input parameters of the first delegated data object; —determining no topological change as a result of the comparison; and—overwriting the input parameters of the first delegated data by the modified one or more input parameters;
  after providing the first data structure: rendering the first output topology therefore forming a mesh; modifying, upon user action, the mesh.
  modifying the mesh comprises performing at least one operation selected among a scaling, a move; and wherein keeping the first delegated to data object further comprises generating the first output topology by the operator of the first delegated data object;
  the first delegated data object and the first output topology form a base mesh;
  replacing the first delegated data object by the second delegated data object further comprises storing the second delegated data object as a new type.

It is further provided a computer program comprising instructions for performing the method.

It is further provided a computer readable storage medium having recorded thereon the computer program and/or the data structure.

It is further provided a system comprising a processor coupled to a memory, the memory having recorded thereon the computer program and/or the data structure. The system may further comprise a graphical user interface.

BRIEF DESCRIPTION OF THE DRAWINGS

Embodiments of the disclosure will now be described, by way of non-limiting example, and in reference to the accompanying drawings, where.

DETAILED DESCRIPTION OF THE INVENTION

Figure 4:
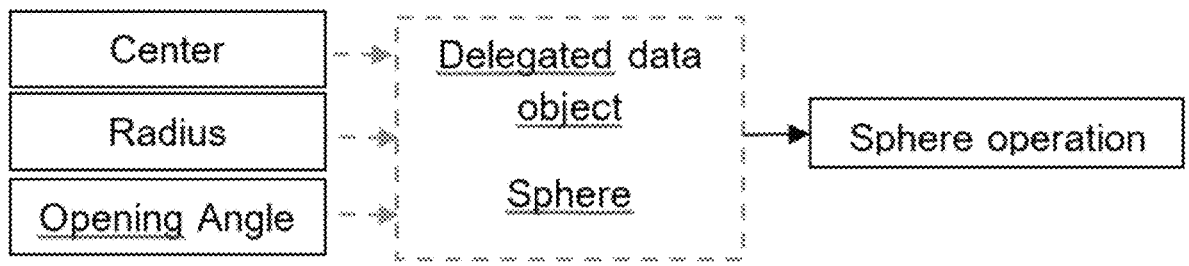
Figure 5:
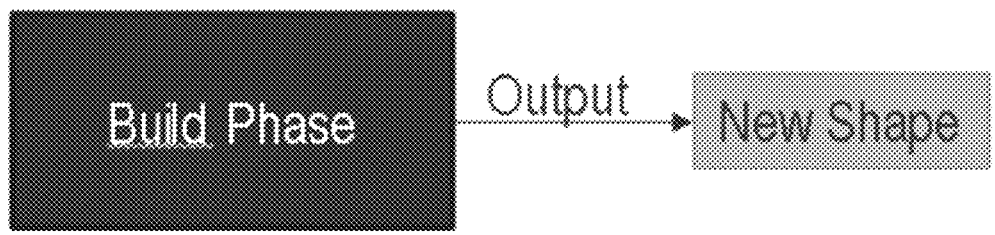
FIGS. 5 to 6 show examples of the build phase.

With reference to FIG. 4, it is proposed a data structure that defines a three-dimensional (3D) model. The data structure comprises one delegated data object and an output topology generator. The delegate data object comprises input parameters specific to the type of the delegated data object and at least one operator specific to the type of the delegated data object for generating an output topology.

Such a data structure improves the design of a 3D model in a history-free computer-aided design system.

Notably, the data structure allows to lift the limitations of the history-free approach by introducing the notion of "weak type" and "flexible modeling". Like the history-free approach, the data structure defining the 3D model is generic. Instead of taking an object defining its type as an input, a generic object delegates its type to another object. This other type of object is also called "weak type". Thanks to this delegated data object, it is possible to design the 3D model by use of the data structure that is a generic feature: the generic feature has a type, like in the history-based approach. However, this type is not strongly linked with the feature as the type is delegated to the delegated data object. This allows the feature to change type along its lifecycle, depending on the context and the operations. Hence, the data structure is sufficiently generic so that it is possible to keep it during design operations and to change it if necessary or asked by the designer. In addition, the data structure offers new possibilities for the designer regarding the creation of features: indeed, the delegated data object is not necessarily linked to a common feature (e.g. plane, cylinder, sphere, torus . . . ) and any shape (e.g. designer by the user) may be used for obtaining a new delegated data object's type.

Figure 7:
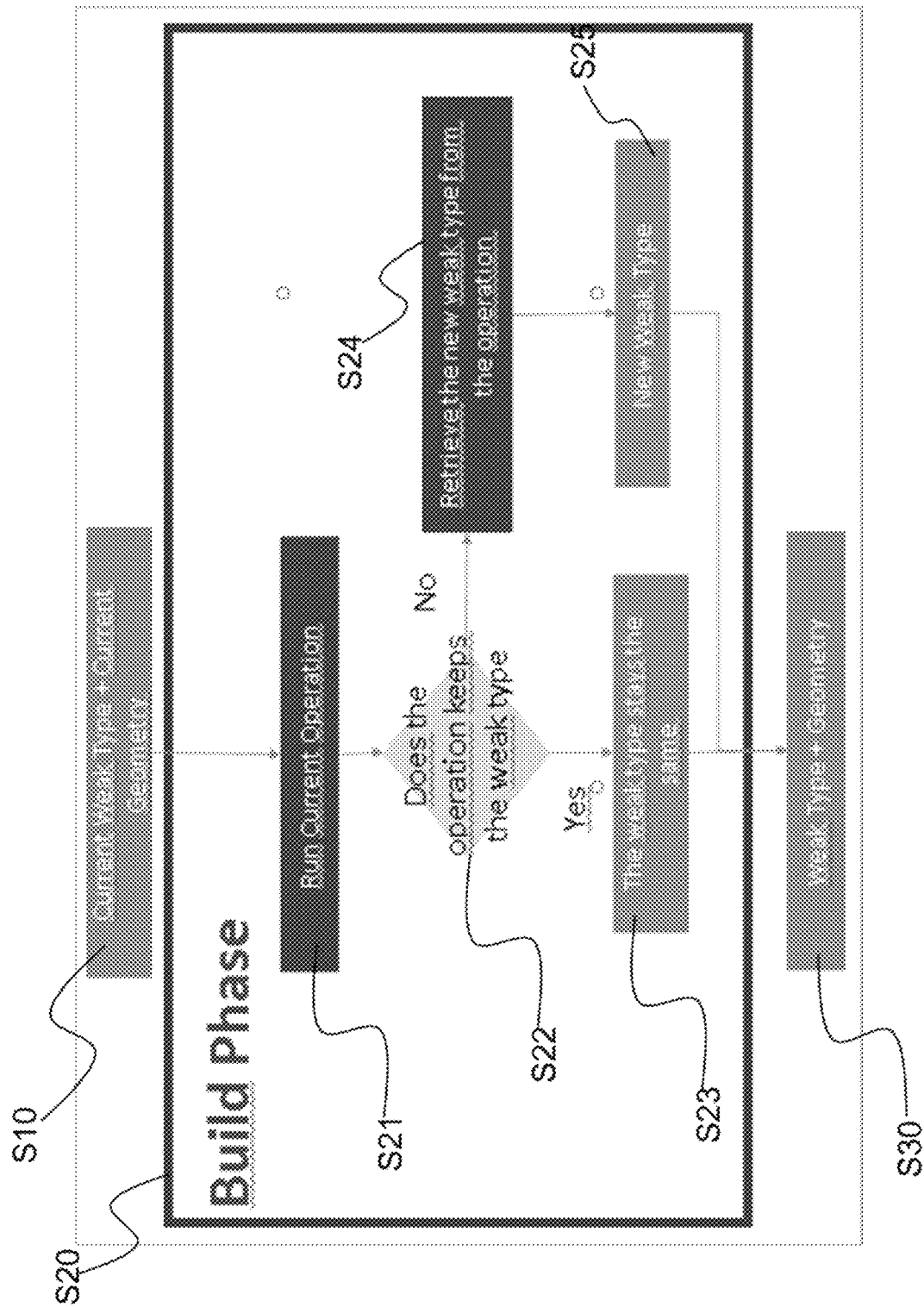
FIG. 7 illustrates a method for designing a 3D model with the data structure.

With reference to FIG. 7, it is proposed a method for designing a 3D model by using the data structure. The proposed method comprises providing a first data structure according to the embodiments. The first data structure defines a first 3D model comprising a first delegated data object and a first output topology. Then, the method comprises modifying, upon user action, the first delegated data object of the first data structure. The method further comprises computing a second output topology as a result of the modification of the first data structure. The method also comprises determining whether a change of topology occurred by comparing the first and second output topologies. The method further comprises replacing the first delegated data object by a second delegated data object if a change of topology is determined between the first and second output topologies or keeping the first delegated data object if no change of topology is determined.

Such a method improves the design of a 3D model in a history-free computer-aided design system. Notably, the method uses the data structure that allows to lift the limitations of history-free approach by introducing the notion of "weak type" and "flexible modeling". Hence, the present method allows to keep or to replace a delegate data object depending a change of topology occurs or not while designing the first 3D model. Because of the history-free approach, the successive operations done on a 3D model are not stored, each operation works on the last state of the feature. It means that some operations can alter the delegated data object of the data structure or generic feature. When it happens, the delegated data object is replaced by a more appropriate one. However, all operations (e.g. design operations) are not too destructive, and in some cases, they can keep the delegated object as is, because in reality, the operation is modifying one of delegated object parameters. In addition, the present method ensures that the object visible in a feature tree never changes, only the underlying delegated data object changes. Consequently, when the delegated data object changes, the system still knows the previous and the new type of the 3D model. Despite the replacement of the delegated data object by a new one, the knowledge of the object being replaced can be kept. Flexibility of the history-free approach is thus improved.

The method is computer-implemented. This means that steps (or substantially all the steps) of the method are executed by at least one computer, or any system alike. Thus, steps of the method are performed by the computer, possibly fully automatically, or, semi-automatically. In examples, the triggering of at least some of the steps of the method may be performed through user-computer interaction. The level of user-computer interaction required may depend on the level of automatism foreseen and put in balance with the need to implement user's wishes. In examples, this level may be user-defined and/or pre-defined.

For instance, the step of modifying the first delegated data object is performed upon user action, e.g. during design operation.

A typical example of computer-implementation of a method is to perform the method with a system adapted for this purpose. The system may comprise a processor coupled to a memory and a graphical user interface (GUI), the memory having recorded thereon a computer program comprising instructions for performing the method. The memory may also store a database. The memory is any hardware adapted for such storage, possibly comprising several physical distinct parts (e.g. one for the program, and possibly one for the database).

The data structure defines a 3D model and the method generally manipulates the data structure, and thus a 3D model. A 3D model is also referred to as modeled object. A modeled object is any object defined by data stored e.g. in the database. By extension, the expression "modeled object" designates the data itself. According to the type of the system, the modeled objects may be defined by different kinds of data. The system may indeed be any combination of a CAD system, a CAE system, a CAM system, a PDM system and/or a PLM system. In those different systems, modeled objects are defined by corresponding data. One may accordingly speak of CAD object, PLM object, PDM object, CAE object, CAM object, CAD data, PLM data, PDM data, CAM data, CAE data. However, these systems are not exclusive one of the other, as a modeled object may be defined by data corresponding to any combination of these systems. A system may thus well be both a CAD and PLM system, as will be apparent from the definitions of such systems provided below.

By CAD system, it is additionally meant any system adapted at least for designing a modeled object on the basis of a graphical representation of the modeled object, such as CATIA. In this case, the data defining a modeled object comprise data allowing the representation of the modeled object. A CAD system may for example provide a representation of CAD modeled to objects using edges or lines, in certain cases with faces or surfaces. Lines, edges, or surfaces may be represented in various manners, e.g. non-uniform rational B-splines (NURBS). Specifically, a CAD file contains specifications, from which geometry may be generated, which in turn allows for a representation to be generated. Specifications of a modeled object may be stored in a single CAD file or multiple ones. The typical size of a file representing a modeled object in a CAD system is in the range of one Megabyte per part. And a modeled object may typically be an assembly of thousands of parts.

In the context of CAD, a modeled object may typically be a 3D modeled object, e.g. representing a product such as a part or an assembly of parts, or possibly an assembly of products. By "3D modeled object", it is meant any object which is modeled by data allowing its 3D representation. A 3D representation allows the viewing of the part from all angles. For example, a 3D modeled object, when 3D represented, may be handled and turned around any of its axes, or around any axis in the screen on which the representation is displayed. This notably excludes 2D icons, which are not 3D modeled. The display of a 3D representation facilitates design (i.e. increases the speed at which designers statistically accomplish their task). This speeds up the manufacturing process in the industry, as the design of the products is part of the manufacturing process.

The 3D modeled object may represent the geometry of a product to be manufactured in the real world subsequent to the completion of its virtual design with for instance a CAD software solution or CAD system, such as a (e.g. mechanical) part or assembly of parts (or equivalently an assembly of parts, as the assembly of parts may be seen as a part itself from the point of view of the method, or the method may be applied independently to each part of the assembly), or more generally any rigid body assembly (e.g. a mobile mechanism). A CAD software solution allows the design of products in various and unlimited industrial fields, including: aerospace, architecture, construction, consumer goods, high-tech devices, industrial equipment, transportation, marine, and/or offshore oil/gas production or transportation. The 3D modeled object designed by the method may thus represent an industrial product which may be any mechanical part, such as a part of a terrestrial vehicle (including e.g. car and light truck equipment, racing cars, motorcycles, truck and motor equipment, trucks and buses, trains), a part of an aerial vehicle (including e.g. airframe equipment, aerospace equipment, propulsion equipment, defense products, airline equipment, space equipment), a part of a naval vehicle (including e.g. navy equipment, commercial ships, offshore equipment, yachts and workboats, marine equipment), a general mechanical part (including e.g. industrial manufacturing machinery, heavy mobile machinery or equipment, installed equipment, industrial equipment product, fabricated metal product, tire manufacturing product), an electro-mechanical or electronic part (including e.g. consumer electronics, security and/or control and/or instrumentation products, computing and communication equipment, semiconductors, medical devices and equipment), a consumer good (including e.g. furniture, home and garden products, leisure goods, fashion products, hard goods retailers' products, soft goods retailers' products), a packaging (including e.g. food and beverage and tobacco, beauty and personal care, household product packaging).

By PLM system, it is additionally meant any system adapted for the management of a modeled object representing a physical manufactured product (or product to be manufactured). In a PLM system, a modeled object is thus defined by data suitable for the manufacturing of a physical object. These may typically be dimension values and/or tolerance values. For a correct manufacturing of an object, it is indeed better to have such values.

By CAM solution, it is additionally meant any solution, software of hardware, adapted for managing the manufacturing data of a product. The manufacturing data generally includes data related to the product to manufacture, the manufacturing process and the required resources. A CAM solution is used to plan and optimize the whole manufacturing process of a product. For instance, it can provide the CAM users with information on the feasibility, the duration of a manufacturing process or the number of resources, such as specific robots, that may be used at a specific step of the manufacturing process; and thus allowing decision on management or required investment. CAM is a subsequent process after a CAD process and potential CAE process.

Such CAM solutions are provided by Dassault Systèmes under the trademark DELMIA®.

By CAE solution, it is additionally meant any solution, software of hardware, adapted for the analysis of the physical behavior of a modeled object. A well-known and widely used CAE technique is the Finite Element Method (FEM) which typically involves a division of a modeled objet into elements which physical behaviors can be computed and simulated through equations. Such CAE solutions are provided by Dassault Systèmes under the trademark SIMULIA®. Another growing CAE technique involves the modeling and analysis of complex systems composed a plurality of components from different fields of physics without CAD geometry data. CAE solutions allow the simulation and thus the optimization, the improvement and the validation of products to manufacture. Such CAE solutions are provided by Dassault Systèmes under the trademark DYMOLA®.

PDM stands for Product Data Management. By PDM solution, it is meant any solution, software of hardware, adapted for managing all types of data related to a particular product. A PDM solution may be used by all actors involved in the lifecycle of a product: primarily engineers but also including project managers, finance people, sales people and buyers. A PDM solution is generally based on a product-oriented database. It allows the actors to share consistent data on their products and therefore prevents actors from using divergent data. Such PDM solutions are provided by Dassault Systèmes under the trademark ENOVIA®.

Figure 13:
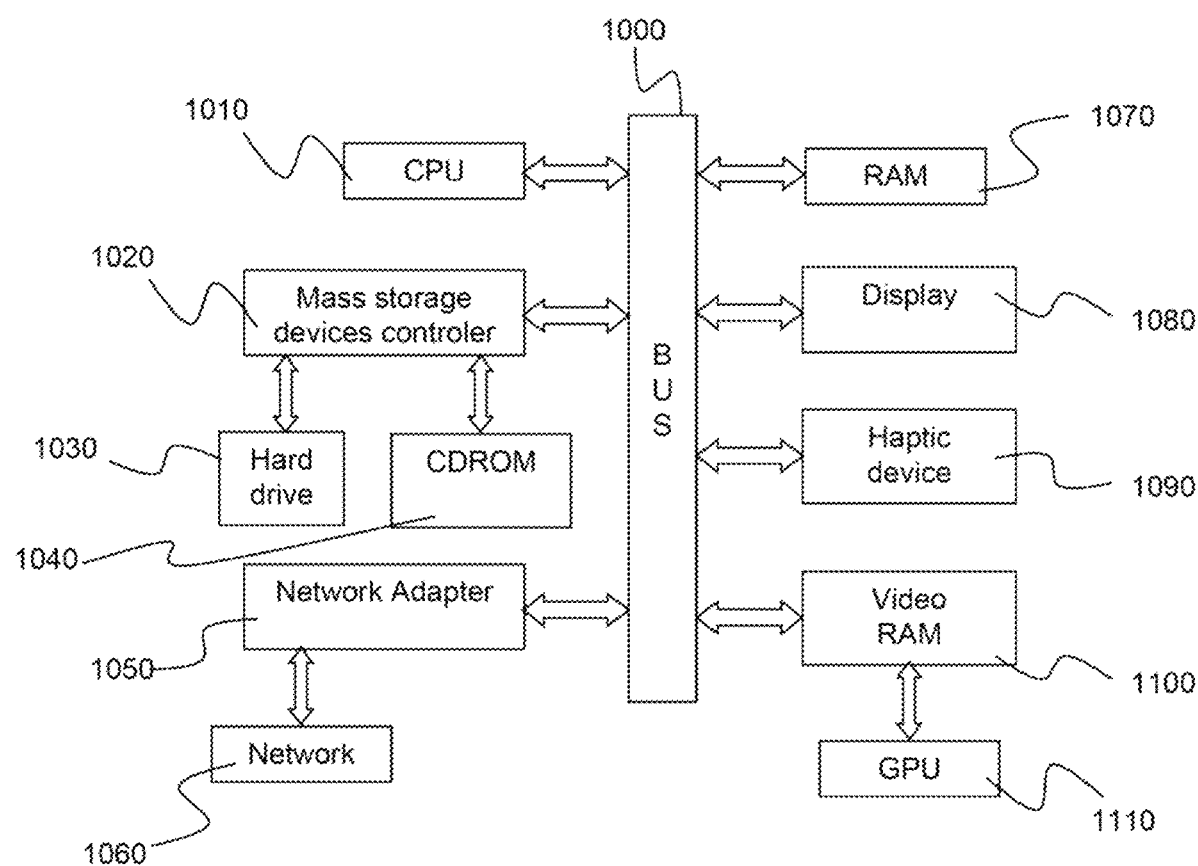
FIG. 13 shows an example of the system.

FIG. 13 shows an example of the system, wherein the system is a client computer system, e.g. a workstation of a user.

The client computer of the example comprises a central processing unit (CPU) 1010 connected to an internal communication BUS 1000, a random-access memory (RAM) 1070 also connected to the BUS. The client computer is further provided with a graphical processing unit (GPU) 1110 which is associated with a video random access memory 1100 connected to the BUS. Video RAM 1100 is also known in the art as frame buffer. A mass storage device controller 1020 manages accesses to a mass memory device, such as hard drive 1030. Mass memory devices suitable for tangibly embodying computer program instructions and data include all forms of nonvolatile memory, including by way of example semiconductor memory devices, such as EPROM, EEPROM, and flash memory devices; magnetic disks such as internal hard disks and removable disks; magneto-optical disks; and CD-ROM disks 1040. Any of the foregoing may be supplemented by, or incorporated in, specially designed ASICs (application-specific integrated circuits). A network adapter 1050 manages accesses to a network 1060. The client computer may also include a haptic device 1090 such as cursor control device, a keyboard or the like. A cursor control device is used in the client computer to permit the user to selectively position a cursor at any desired location on display 1080. In addition, the cursor control device allows the user to select various commands, and input control signals. The cursor control device includes a number of signal generation devices for input control signals to system. Typically, a cursor control device may be a mouse, the button of the mouse being used to generate the signals. Alternatively or additionally, the client computer system may comprise a sensitive pad, and/or a sensitive screen.

The computer program may comprise instructions executable by a computer, the instructions comprising means for causing the above system to perform the method. The program may be recordable on any data storage medium, including the memory of the system. The program may for example be implemented in digital electronic circuitry, or in computer hardware, firmware, software, or in combinations of them. The program may be implemented as an apparatus, for example a product tangibly embodied in a machine-readable storage device for execution by a programmable processor. Method steps may be performed by a programmable processor executing a program of instructions to perform functions of the method by operating on input data and generating output. The processor may thus be programmable and coupled to receive data and instructions from, and to transmit data and instructions to, a data storage system, at least one input device, and at least one output device. The application program may be implemented in a high-level procedural or object-oriented programming to language, or in assembly or machine language if desired. In any case, the language may be a compiled or interpreted language. The program may be a full installation program or an update program. Application of the program on the system results in any case in instructions for performing the method.

The data structure is a functional data that serves to control and store operations of the CAD system (or the like). And therefore, the data structure serves to control operations for designing a 3D model, e.g. on a history-free CAD system. Especially, the data structure improves design operations as creating shapes have type and parameters that are passed to a generic feature which is not strongly typed, but on the contrary weakly typed. Here, the data structure is functional data for the technical feature of designing a 3D model, e.g. representing an object of the real world.

"Designing a 3D modeled object" designates any action or series of actions, which are at least part of a process of elaborating a 3D modeled object. Thus, the method may comprise creating the 3D modeled object from scratch. Alternatively, the method may comprise providing a 3D modeled object previously created, and then modifying the 3D modeled object. The method may be included in a manufacturing process, which may comprise, after performing the method, producing a physical product corresponding to the modeled object. In any case, the modeled object designed by the method may represent a manufacturing object. The modeled object may thus be a modeled solid (i.e. a modeled object that represents a solid). The manufacturing object may be a product, such as a part, or an assembly of parts. Because the method improves the design of the modeled object, the method also improves the manufacturing of a product and thus increases productivity of the manufacturing process.

Figure 1:
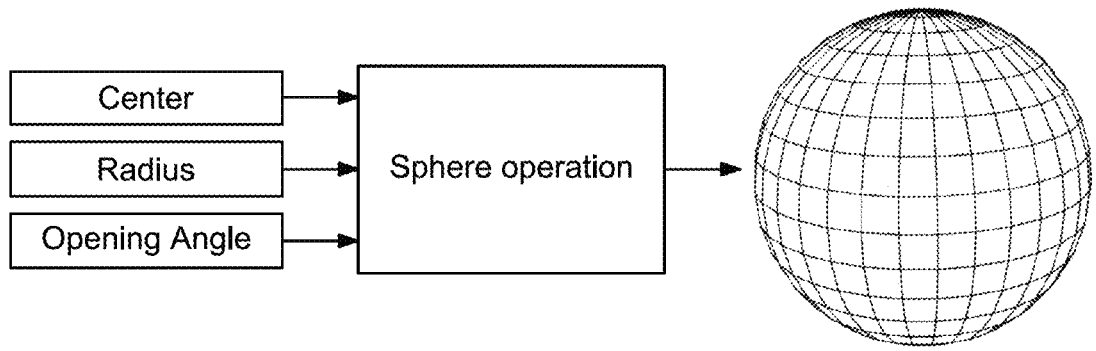
FIG. 1 shows an example of a strongly typed object.

FIG. 1 illustrates an example of a strongly typed data structure generally used by known history-based CAD systems. In this example, the data structure defines a feature 3D Sphere, where the 3D Sphere is a typed 3D model. The feature 3D sphere defines a type 3D sphere, where the type comes with a set of parameters that are the center, the radius and the opening angle of the sphere. The data structure comes with one single operation which is a sphere operation. The output of the typed feature returns the topology of a sphere, as represented on right of FIG. 1.

Now, from a history-free approach point of view, only the mesh representing the sphere is available to the system. The history-free paradigm is that the feature is generic: this means that the CAD system is not aware that the mesh (the wireframe that comprises all the vertices, the edges and from that information faces of the wireframe can be made) represents a sphere as the CAD system only accesses the mesh. So, even though the designer can quickly iterate on the shape, he can only modify the current state of the mesh; thus modifying only a parameter of the sphere is not possible, e.g. the designer cannot modify the radius of the mesh having a 3D shape of 3D sphere.

Figure 2:
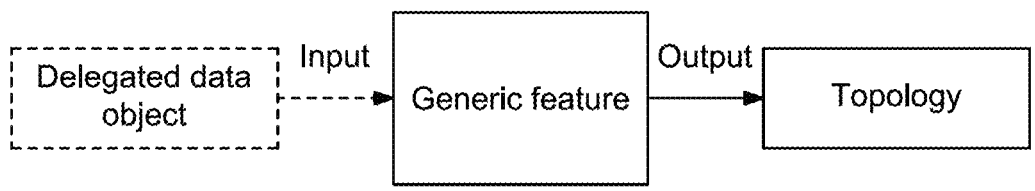
FIGS. 2, 3 and 4 show examples of the data structure of the embodiments.

FIG. 2 illustrates an example of the data structure of the embodiments. The data structure (or feature) is generic, which means that the data structure is not typed, and thus not linked to one specific type of object, e.g. a sphere primitive. A feature is a building block from which a shape can be obtained. Features are commonly used in 3D modeling for building a 3D modeled object. As non-limiting examples, a "classic" feature can be of the type parallelepiped (e.g. a cuboid), cylinder, sphere, pyramid, cone, quadric, ruled surface, tori . . . . More generally, a feature can represent any shape, and even very complex shapes such as a car or a plane, while the feature owns a set of parameters that are sufficient for a specific operator to generate the shape. A set of features may allows describing an industrial product, e.g. the industrial product represented by a mesh in a history-free CAD system.

The data structure being generic, it can be used in a history-free CAD system. A generic feature is independent of a type of feature. However, the generic feature can receive data, execute data and obtain a result that is similar to the one provided by a feature having a type. The data structure takes as input a delegated data object that defines a type of the feature. The delegated data object contributes to "weakly type" the generic feature. This means that the data structure is generic, with a genericity that is restrained by the delegated data object. As the data structure is generic, the data structure not linked to one particular operation. The operation comes together with the delegated data object. Hence, the (generic) data structure inherits a type and an operator that is specific to the type the delegated data object. The inheritance is performed by providing as an input the delegated data object (which comprises the type and the specific operator) to the generic feature. The output is a topology that is computed by the generic feature from the input. The topology is thus specific to the type provided in input.

Figure 3:
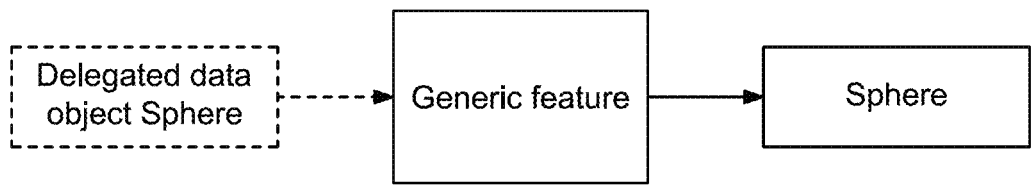

This is illustrated on FIG. 3 where the (generic) data structure takes in input a delegated data object of the type sphere and the topology produced by the data structure is a sphere. The production of the sphere is controlled by the operator of the type, the operator being executed (or run) by the data structure. Hence, the operator of a delegated data object is retrieved and then executed by the data structure.

The delegated data object comprises inputs parameters that are specific of the type of the delegated data object. The delegated also comprises one or more operators that are specific to the type of the delegated data object.

FIG. 4 illustrates an example of the delegated data object specific to the type "sphere". When the delegated object is executed by the generic feature, that is when the system asks the feature "sphere" to build itself, the generic feature delegates this to the delegated data object for the specific type. In this example above, the delegated data object knows it should build a sphere using the 'Center', 'Radius' and 'Opening Angle' as parameters. As such, the delegated object will generate an operation using its input parameters. This operation will then be used by the generic feature to generate its topology. So, if for any reason, the delegated object is replaced by another one, it will be transparent from the generic feature point of view as it will still retrieve and run the operation given by the delegated object.

The parameters of the delegated data object allow instantiating the operator that generates an output topology. For instances, as known in the art:

the input parameters specific to a type "sphere" are the center, the radius and the opening angle;

the input parameters specific to a type "cylinder" are the direction of the axis, the height of the cylinder, the center and the radius of the circle;

the input parameters specific to a type "cone" are the axis direction, the height of the cone, the center and the radius of the cone base;

the input parameters specific to a type "torus" are the direction vector, the center, the radius for the great circle and the radius for the small circle.

The data structure further comprises an output topology generated by the operator. The topology depends on the type of the delegated data object.

In examples, an operation may be performed by the operator specific to the type of the delegated data object. In such situation the operation is also referred to as internal operation: the topology of the output topology is not modified. An internal operation is typically an operation executed as a result of a modification of an input parameter of the delegated data object, e.g. a scale or a move of the output topology. A list of these operations may be associated with the delegated data object so that the generic feature has the knowledge that the modification may be executed by the operation already "loaded" on the generic feature.

In examples, an operation may be performed by an operator that is not the specific operator of the delegated data object. In such situation the operation is also referred to as external operation: the output topology is modified. An external operation is typically an operation that cannot be executed by the operator of the delegated data object as the topology of the output is modified, e.g. a cut is performed on the 3D representation of the 3D model defined by the data structure. In order to execute the operation, the data structure may comprise an interface adapted to add or to remove at least one operator. The operator may be "loaded" on the data structure and executed thereof. The operator of the delegated data object may be kept loaded on generic feature or simply removed. The data structure contains at least one operator at all times.

In examples, the output topology may be rendered so that a representation of the 3D model defined by the data structure is accessible, e.g. display to a user. The output topology may be represented with a mesh, as known in the art. The mesh may be a subdivision surface that is a method of representing a smooth surface via the specification of a coarser piecewise linear polygon mesh. The mesh is a collection of vertices, edges and faces that defines the shape of a 3D model. The mesh thus defines a geometry from which a graphical representation of the output topology of the 3D model can be generated. The mesh may be a subdivision surface that is generally used to model free-form surfaces of arbitrary topology. A subdivision surface is defined as the limit of a refinement process starting with a polygonal base mesh of control points. The control points of the base mesh transmit progressive changes to the subdivision surface. The mesh of the subdivision surface is thus refined as a result of an iteration of a subdivision process that is controlled by the control points of the base mesh. Hence, the subdivision surfaces approximate or interpolate the base mesh. The Catmull-Clark algorithm is an example of such a subdivision scheme. Base meshes are widely used in CAD and a simple definition can be that a base mesh comprises the definition of a subdivision mesh and control points of subdivision mesh. It is to be understood that several dedicated algorithms may be used.

Figure 14A:
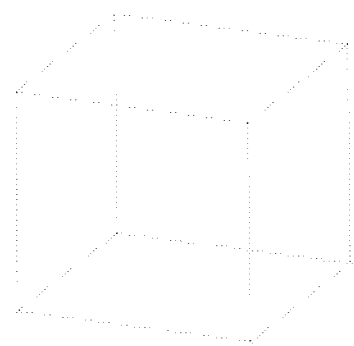
FIGS. 14a, 14b, 14c and 14d show examples of base meshes defined by the data structure.
Figure 14B:
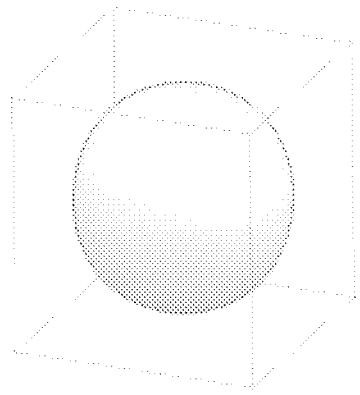
Figure 14C:
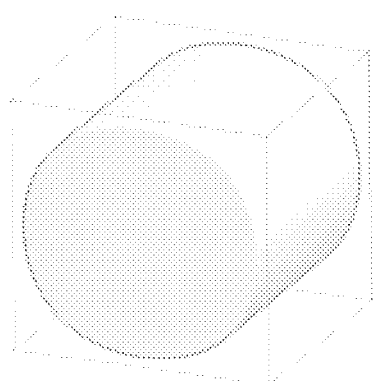
Figure 14D:
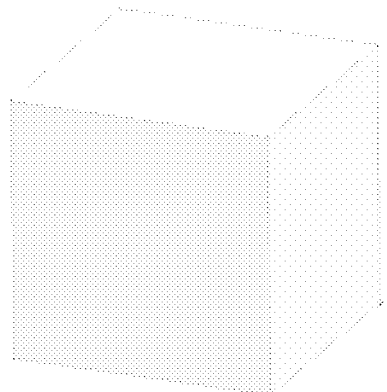

Thus, a design operation may be a modification of the mesh upon user action on one of the control points of the base mesh. Examples of design operations on the base mesh are represented on FIGS. 14a, 14b, 14c and 14d. FIG. 14a illustrates an example of base mesh that is a Cubic Base Mesh. The cubic Base mesh has 8 control points and the edges have the same length. No weight is attached to any of the vertices, edges or face. In FIG. 14b, the user has displaced (or moved) a control point of the base mesh of FIG. 14a that controls the subdivision of the original cube into a sphere, e.g. with a Catmull-Clark algorithm. FIG. 14c illustrates the subdivision surface obtained from the base mesh of FIG. 14a that is Cubic Base Mesh (8 control points) with the edges have the same length, a Weight (100% sharp) on two opposite faces. A cylinder is therefore obtained. FIG. 14d illustrates the subdivision surface obtained from the base mesh of FIG. 14a that is Cubic Base Mesh (8 control points) with the edges have the same length and a weight (100% sharp) on each edge. A cube is obtained. In these examples, the control points modify the weight of vertices or edges or faces and thus the subdivision process. Attractiveness one the mesh is made by the weights.

Figure 6:
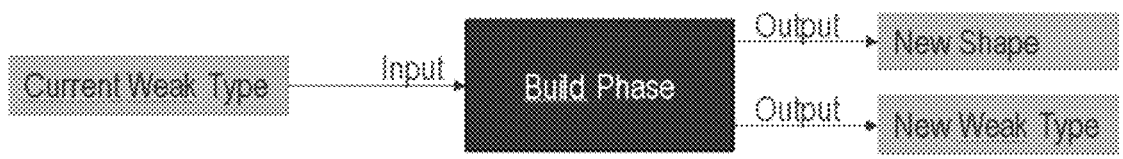

Referring now to FIGS. 6 and 6, a build phase of the 3D model defined by the data structure according to the embodiments is now discussed.

FIG. 6 represents a build phase of a generic feature in a history-free system, as known in the art. When a user asks for the modification of a shape, the system goes through a Build phase of the shape. Usually, during this phase, an operator representing the current modification is called, the result of this operator is the new shape associated to the current shape. The build phase has one output, which is the new shape.

FIG. 6 represents a build phase of the data structure of the embodiments. The build phase of the present embodiments is different because the Build phase does not just compute the new shape according to the current modification, it also ensures that the delegated data object is still consistent and if not, a new delegated data object is provided to the data structure.

The Build phase is now discussed with more precision in reference to FIG. 7 that is an example of a computer-implemented method for designing a 3D model with the data structure of the present embodiments.

At S10, a first data structure according to the embodiments is provided. The first data structure defines a first 3D model and comprises a first delegated data object and a first output topology. The first output topology defines a current geometry that may be a current representation of the 3D model, e.g. a base mesh is displayed.

At S20, the build phase is performed.

The build phase starts with a user modification (S21) of the first delegated data object. The modification of the first delegated data object may comprise directly modifying one or more input parameters of the first delegated data object. Alternatively, the modification may comprise modifying the 3D model (the 3D shape, that is, the representation of the 3D model) without explicitly modifying one or more parameters of the delegated data object. Another possibility is that the first delegated data object is replaced by another one.

Then, it is determined (S22) whether a change of the first output topology occurred as a result of the user modification (S21). It is to be understood that the detection that a change of topology occurred can be performed with any known technique.

As an example, the determination is performed by performing a comparison between the first output topology and a second output topology, where the second output topology is the topology obtained after the user modification.

The comparison between the first output topology and a second output topology may comprise performing a comparison of the first base mesh and the second base mesh, where the first base mesh is the base mesh corresponding to the geometry before the modification and the second base mesh is the one corresponding to the geometry avec the modification. Computing a topology change is easier from a mesh.

If the current operation (S21) has kept the delated data object, that is, the type 3D shape is not changed as a result of the modification, then S23 is performed. Otherwise S24 and S25 are performed.

Figure 8:
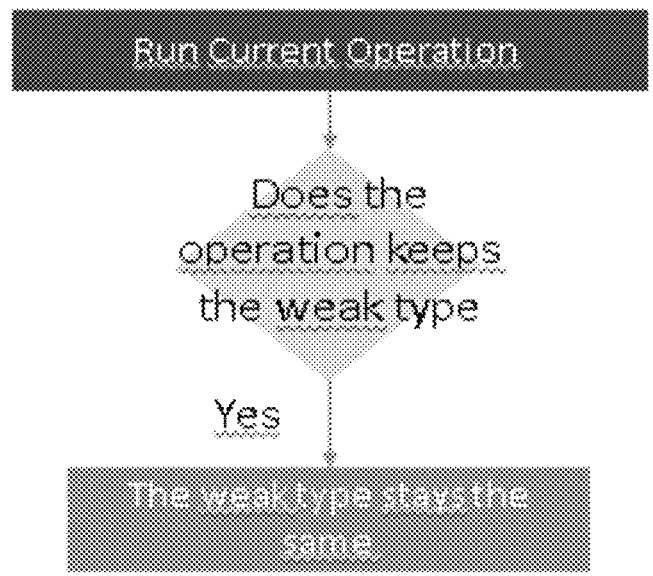
FIGS. 8 to 9 illustrate examples of FIG. 7.

S23 is now discussed in reference with FIG. 8. As no change in the topology has been determined, the first delegated data object is kept. In other words, the type of the 3D model is not changed. This is the case when one or more parameters of the first delegated data object have been modified, or when the modification of the 3D shape without explicitly changing the weak type parameters does not affect the first topology output.

Thus, when the user has modified one or more input parameters of the first delegated data object, the input parameters of the first delegated data are overwritten by the modified one or more input parameters. Interestingly, in such situation, the verification of a topological change may be not performed.

And when the modification of the 3D shape without explicitly changing the weak type parameters does not affect the first topology output, the first delegated data is kept and the parameters are modified in accordance with the modification of the 3D shape. The new value of one or more parameters is computed in accordance with the modifications of the 3D shape. The computation of the one or more new values is performed as known in the art.

The modification of the 3D shape may be done by the user by performing directly modification on the mesh. In this case, the first output topology is rendered therefore forming a base mesh, as known in the art. And the user performs the modification on the base mesh, e.g. the user moves vertices or edges or control points of the base mesh.

In examples, the modification of the (base) mesh comprises performing at least one operation that is selected among a scaling, a move, etc. . . . . . As these operations are known to be topologically neutral (that is, they do not modify the topology), the first output topology will be generated by the unchanged operator of the first delegated data object.

Figure 9:
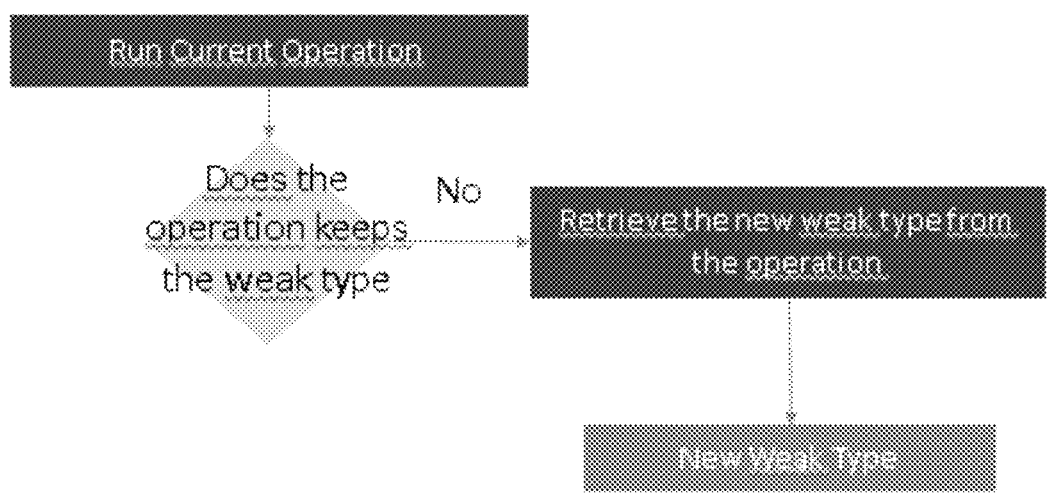

S24 and S25 are now discussed in reference with FIG. 9. At S24, a new delegated data object is selected to replace (S25) the current one which is no more valid.

The identification of the new delegated data object may be performed by comparing the second output topology (the new one obtained as a result of the modification) with output topologies of a list of output topologies. Each output topology of the list is associated with one delegated data object, so that when a correspondence between the new output topologies and an output topology of the list identified, the associated delegated data object is retained as the new one. Said otherwise, a third delegated data object is selected as a result of the comparison, and the third delegated data object is a delegated data object of the list with an associated output topology that is the same as the second output topology. The selection of the third delegated data object may be automatically performed, e.g. the user does not intervene.

Alternatively, the comparison may be performed between 3D shapes; in this case, the list comprises 3D shapes that are associated with delegated data objects.

However, cases may exist where no new delegated data object can be selected in the list. A typical reason might be that no identical topology is referenced in the list. In this situation, the user is provided with one or more one delegated data objects of the list having associated output topologies that are the closest to the second output topology. The distance between two topologies is measured as known in the art. For instance, this can be carried out with a computation of confusion of the meshes representing the output topologies. At least the positions of the vertices of the meshes are compared (with a given tolerance), and eventually the edges connecting the vertices. A ranking may be carried out from the measures, and the first topologies of the ranking are provided to the user.

Alternatively, the comparison may be performed between 3D shapes; in this case, similarity measures are performed between the current 3D shape (the one modified upon user action) and the list of 3D shapes that are associated with delegated data objects. The delegated data objects with the 3D shapes that are the most similar to the current one are presented to the user.

The list may further comprise one generic delegated data object. This generic delegated data object can be used in the event the user is not satisfied by the proposed topologies. Alternatively, the generic delegated data object may be the sole delegated data object proposed to the user.

After the selection of one of the provided delegated data objects, the first delegated data object is replaced by the selected delegated data object.

Interestingly, the user has the possibility to create a new type at any stage of the method, and more particularly when S24 and S25 are carried out. In an example, the replacement of the first delegated data object by the second delegated data object may comprise storing the second delegated data object as a new type.

Referring back to FIG. 7, at S30, the data structure comprises, after the user modification, a weak type that is the same or a new one, and a topological output.

Figure 10A:
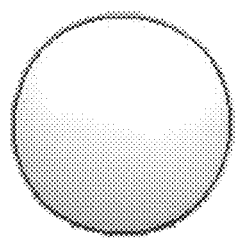
FIGS. 10a, 10b, 11a, 11b, 12a, 12b illustrate base meshes of the data structure output.
Figure 10B:
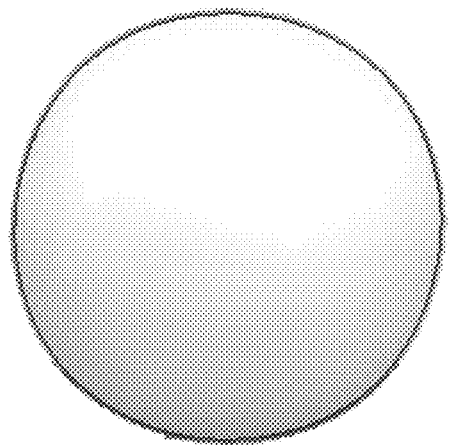

FIG. 10a shows a data structure that corresponds to a type sphere. FIG. 10b shows the same data structure after a scale. Indeed, the scale is an operation that does not modify the delegated data object of FIG. 10a.

Figure 11A:
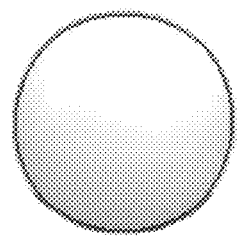
Figure 11B:
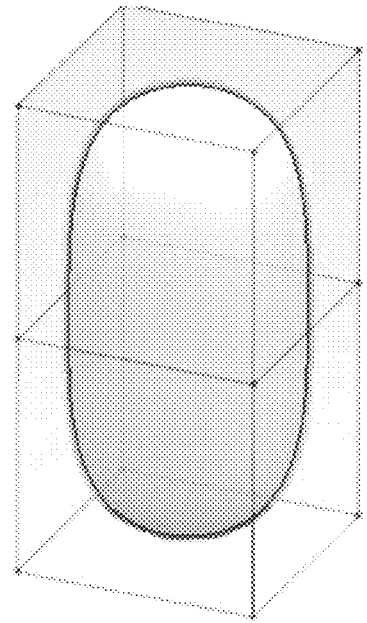

FIG. 11a shows the data structure of FIG. 10a. FIG. 11b shows the same data structure after an extrude operation. The base mesh has been modified, thus producing a topological change of the topological output. A subdivision is thus obtained and a new delegated data object is identified in a list of delegated data objects. The delegated data object will replace the current one.

Figure 12A:
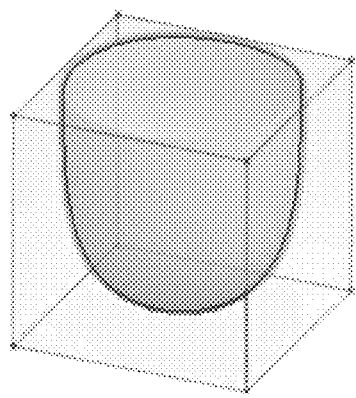
Figure 12B:
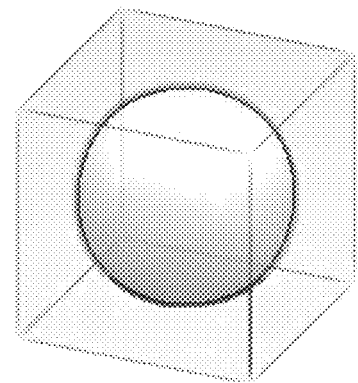

FIG. 12a shows a generic object. FIG. 12b shows the same object after that a fill operation has been performed on the top of the generic object. The fill operation result in a sphere. Indeed, the system is able to extract the relevant information in order to fill the sphere's parameters values. This is possible by comparing the 3D Shape against a list of delegated data objects' shape. If the system recognizes several possible delegated data objects, it will prompt a message to the user for him to choose between the possible choices.

The invention claimed is:

1. A non-transitory computer-readable memory storing a computer-implemented data structure, the data structure defining a three-dimensional (3D) model, the data structure being functional data for controlling operations for designing the three-dimensional model in a history-free CAD system, the data structure comprising:
a first computing object, which is a generic feature independent of a feature type, the generic feature being unlinked to any geometric type or to any geometric operation and including no geometric parameter and no geometric operator,
a second computing object, which is a delegated data object, the generic feature taking as input the delegated data object, the delegated data object comprising:
input parameters specific to a geometric type of the delegated data object, and
at least one operator specific to the geometric type of the delegated data object for generating an output topology, the input parameters allowing instantiation of the operator; and
a third computing object, which is an output topology generated by the operator, the output topology being computed by the generic feature from the input delegated data object.

2. A computer-implemented method for designing a three-dimensional (3D) model in a history-free CAD system, comprising:
obtaining a first data structure defining a first three-dimensional (3D) model, the first data structure including:
a first computing object, which is a generic feature independent of a feature type, the generic feature being not linked to any geometric type or to any geometric operation and including no geometric parameter and no geometric operator,
a second computing object, which is a first delegated data object, the generic feature taking as input the delegated data object, the delegated data object including:
input parameters specific to a geometric type of the first delegated data object, and
at least one operator specific to the geometric type of the first delegated data object for generating an output topology, the input parameters allowing instantiation of the operator, and
a third computing object, which is a first output topology generated by the operator, the first output topology being computed by the generic feature from the input first delegated data object;
modifying, upon user action, the first delegated data object;
computing a second output topology as a result of the modification of the first data structure;
determining whether a change of topology occurred by comparing of the first and second output topologies; and
replacing the first delegated data object by a second delegated data object if a change of topology is determined between the first and second output topologies or keeping the first delegated data object if no change of topology is determined.

3. The computer-implemented method of claim 2, wherein replacing the delegated data object by the second delegated data object includes:
comparing the second output topology with a list of output topologies, each output topology of the list being associated with one delegated data object, and
automatically selecting a third delegated data object as a result of the comparison, the third delegated data object being a delegated data object of the list with an associated output topology that is the same as the second output topology.

4. The computer-implemented method of claim 3, further comprising, if no delegated data object of the list is selected as a result of the comparison:
presenting to the user one or more one delegated data objects of the list having associated output topologies that are the closest to the second output topology, including one generic delegated data object, and
receiving a selection by the user of one of the provided delegated data objects.

5. The computer-implemented method of claim 2, wherein modifying, upon user action, the first delegated data object includes:
modifying one or more input parameters of the first delegated data object;
determining no topological change as a result of the comparison, and
overwriting the input parameters of the first delegated data by the modified one or more input parameters.

6. The computer-implemented method of claim 2, further comprising, after obtaining the first data structure:
rendering the first output topology therefore forming a mesh, and
modifying, upon user action, the mesh.

7. The computer-implemented method of claim 6, wherein modifying the mesh includes:
performing at least one operation selected among a scaling and a move; and
wherein keeping the first delegated data object further includes generating the first output topology by the operator of the first delegated data object.

8. The computer-implemented method of claim 2, wherein the first delegated data object and the first output topology form a base mesh.

9. The computer-implemented method of claim 2, wherein replacing the first delegated data object by the second delegated data object further includes storing the second delegated data object as a new type.

10. A non-transitory computer readable storage medium having recorded thereon a computer program comprising instructions for performing a method of designing a three-dimensional (3D) model in a history-free CAD system, the method comprising:
obtaining a first data structure defining a first three-dimensional (3D) model, the first data structure including:
a first computing object, which is a generic feature independent of a feature type, the generic feature being not linked to any geometric type or to any geometric operation and including no geometric parameter and no geometric operator,
a second computing object, which is a first delegated data object, the generic feature taking as input the delegated data object, the delegated data object including:
input parameters specific to a geometric type of the first delegated data object, and
at least one operator specific to the geometric type of the first delegated data object for generating an output topology, the input parameters allowing instantiation of the operator, and
a third computing object, which is a first output topology generated by the operator, the first output topology being computed by the generic feature from the input first delegated data object;

modifying, upon user action, the first delegated data object;

computing a second output topology as a result of the modification of the first data structure;

determining whether a change of topology occurred by comparing of the first and second output topologies; and replacing the first delegated data object by a second delegated data object if a change of topology is determined between the first and second output topologies or keeping the first delegated data object if no change of topology is determined.

11. The non-transitory computer readable storage medium of claim 10, wherein replacing the delegated data object by the second delegated data object includes:

comparing the second output topology with a list of output topologies, each output topology of the list being associated with one delegated data object, and automatically selecting a third delegated data object as a result of the comparison, the third delegated data object being a delegated data object of the list with an associated output topology that is the same as the second output topology.

12. The non-transitory computer readable storage medium of claim 11, further comprising, if no delegated data object of the list is selected as a result of the comparison:

presenting to the user one or more one delegated data objects of the list having associated output topologies that are the closest to the second output topology, including one generic delegated data object, and receiving a selection from the user of one of the provided delegated data objects.

13. The non-transitory computer readable storage medium of claim 10, wherein modifying, upon user action, the first delegated data object includes:

modifying one or more input parameters of the first delegated data object, determining no topological change as a result of the comparison, and overwriting the input parameters of the first delegated data by the modified one or more input parameters.

14. The non-transitory computer readable storage medium of claim 10, further comprising, after providing the first data structure:

rendering the first output topology therefore forming a mesh; and modifying, upon user action, the mesh.

15. The non-transitory computer readable storage medium of claim 14, wherein modifying the mesh includes:

performing at least one operation selected among a scaling and a move, and wherein keeping the first delegated data object further includes generating the first output topology by the operator of the first delegated data object.

16. The non-transitory computer readable storage medium of claim 10, wherein the first delegated data object and the first output topology form a base mesh.

17. The non-transitory computer readable storage medium of claim 10, wherein replacing the first delegated data object by the second delegated data object further includes storing the second delegated data object as a new type.

18. A system comprising:

a processor coupled to a non-transitory memory, the non-transitory memory having recorded thereon a three-dimensional (3D) model of a history-free CAD system including:

a first computing object, which is a generic feature independent of a feature type, the generic feature being not linked to any geometric type or to any geometric operation and including no geometric parameter and no geometric operator, a second computing object, which is a delegated data object, the generic feature taking as input the delegated data object, the delegated data object including:

input parameters specific to a geometric type of the delegated data object, and at least one operator specific to the geometric type of the delegated data object for generating an output topology, the input parameters allowing instantiation of the operator; and a third computing object, which is an output topology generated by the operator, the output topology being computed by the generic feature from the input one delegated data object, wherein the processor is configured to compute the output topology based on the generic feature from the input one delegated data object.

* * * * *